United States Patent
Yuu

(10) Patent No.: US 10,043,956 B2
(45) Date of Patent: Aug. 7, 2018

(54) METHOD FOR MANUFACTURING LIGHT EMITTING DEVICE

(71) Applicant: NICHIA CORPORATION, Anan-shi, Tokushima (JP)

(72) Inventor: Hiroki Yuu, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/717,242

(22) Filed: Sep. 27, 2017

(65) Prior Publication Data

US 2018/0090648 A1 Mar. 29, 2018

(30) Foreign Application Priority Data

Sep. 29, 2016 (JP) ................................ 2016-191246
Sep. 26, 2017 (JP) ................................ 2017-184703

(51) Int. Cl.

| H01L 33/24 | (2010.01) |
|---|---|
| H01L 33/52 | (2010.01) |
| H01L 33/00 | (2010.01) |
| H01L 33/44 | (2010.01) |
| H01L 21/82 | (2006.01) |
| H01L 33/62 | (2010.01) |

(52) U.S. Cl.
CPC .............. *H01L 33/52* (2013.01); *H01L 21/82* (2013.01); *H01L 33/005* (2013.01); *H01L 33/44* (2013.01); *H01L 33/62* (2013.01); *H01L 2933/005* (2013.01); *H01L 2933/0025* (2013.01); *H01L 2933/0066* (2013.01)

(58) Field of Classification Search
CPC ........ H01L 33/005; H01L 33/44; H01L 33/52
USPC ............................................................ 438/28
See application file for complete search history.

(56) References Cited

U.S. PATENT DOCUMENTS

| 2013/0307014 A1* | 11/2013 | Yamamoto ............. H01L 33/62 257/99 |
|---|---|---|
| 2014/0227813 A1 | 8/2014 | Yoneda et al. |
| 2015/0076546 A1 | 3/2015 | Obata et al. |
| 2015/0364661 A1 | 12/2015 | Sawada et al. |
| 2016/0254428 A1* | 9/2016 | Ting ................... H01L 33/0079 257/99 |

(Continued)

FOREIGN PATENT DOCUMENTS

| JP | 2012-227470 A | 11/2012 |
|---|---|---|
| JP | 2014-179590 A | 9/2014 |
| JP | 2015-060964 A | 3/2015 |

(Continued)

*Primary Examiner* — David S Blum

(57) ABSTRACT

A method for manufacturing a light emitting device includes: preparing an intermediate body including a plurality of light emitting elements spaced apart from each other, each of the light emitting elements having a pair of electrodes disposed on the same side, and a covering member covering side surfaces of the light emitting elements while a part of a surface of each of the electrodes is exposed from the covering member, the covering member having a recess between adjacent ones of the light emitting elements; forming a metal layer that continuously covers the surface of each of the electrodes of the light emitting elements and an inner surface of the recess of the covering member; and cutting the metal layer and the covering member at the inner surface of the recess.

9 Claims, 8 Drawing Sheets

(56) References Cited

U.S. PATENT DOCUMENTS

2017/0012174 A1 1/2017 Yoneda et al.
2017/0133554 A1 5/2017 Okuyama

FOREIGN PATENT DOCUMENTS

| JP | 2016-004892 A | 1/2016 |
| JP | 2016-021557 A | 2/2016 |

* cited by examiner

METHOD FOR MANUFACTURING LIGHT EMITTING DEVICE

CROSS-REFERENCE TO RELATED APPLICATION

This application claims priority to Japanese Patent Applications No. 2016-191246 filed on Sep. 29, 2016 and No. 2017-184703 filed on Sep. 26, 2017, the disclosures of which are hereby incorporated by reference in its entirety.

BACKGROUND

The present disclosure relates to a method for manufacturing a light emitting device.

Light emitting devices including light emitting elements have been widely used in the past as a light source in liquid crystal television backlights, lighting fixtures, and the like. As such a light emitting device, a light emitting device in which the electrodes of LED elements serve as connection electrodes for a mother board has been proposed (Japanese Patent Publication No. 2012-227470 A).

SUMMARY

In view of this, it is an object of the present invention to provide a method for manufacturing a light emitting device with which mounting is easier while preventing mounting difficulties of the light emitting device, which is caused by a relatively small electrode for mounting.

A method for manufacturing a light emitting device according to an embodiment of the present invention includes: preparing an intermediate body including a plurality of light emitting elements spaced apart from each other, each of the light emitting elements having a pair of electrodes disposed on the same side, and a covering member covering side surfaces of the light emitting elements while a part of a surface of each of the electrodes is exposed from the covering member, the covering member having a recess between adjacent ones of the light emitting elements; forming a metal layer that continuously covers the surface of each of the electrodes of the light emitting elements and an inner surface of the recess of the covering member; and cutting the metal layer and the covering member at the inner surface of the recess.

With the method for manufacturing a light emitting device according to the embodiment of the present invention, the light emitting device with which mounting is easier can be manufactured.

DESCRIPTION

An embodiment of the present invention will be described below with reference to the appropriate drawings. It should be appreciated, however, that a light emitting device and a method for manufacturing the light emitting device described below are illustrations to give a concrete form to technical ideas of the embodiment, and do not limit the present invention. In particular, the size, material, shape, relative disposition and so forth of the components do not limit the technical scope of the present invention, and are intended to be explanatory examples which can sometimes be exaggerated to make the explanation clear. The embodiment described below can apply appropriate combinations of each configuration and so forth.

The method for manufacturing a light emitting device in this embodiment includes the steps of preparing an intermediate body including a plurality of light emitting elements that are separated from each other and have a pair of electrodes on the same side, and a covering member that covers the side surfaces of the light emitting elements so that part of the surface of the pair of electrodes is exposed and that has recesses between the plurality of light emitting elements; forming a metal layer that continuously covers the surfaces of the electrodes of the light emitting elements inner surfaces of the recesses of the covering member; and cutting the metal layer and the covering member at the inner surfaces of the recesses.

1. Step of Preparing Intermediate Body

First, a step is performed to prepare an intermediate body, which includes a plurality of light emitting elements that are separated from each other and have a pair of electrodes on the same side, and a covering member that covers the side surfaces of the light emitting elements so that part of the surface of the pair of electrodes is exposed and that has recesses between the plurality of light emitting elements. This step can be performed by the following steps, for example.

1-1. Disposition of Light Emitting Elements on Support

Figure 1A:
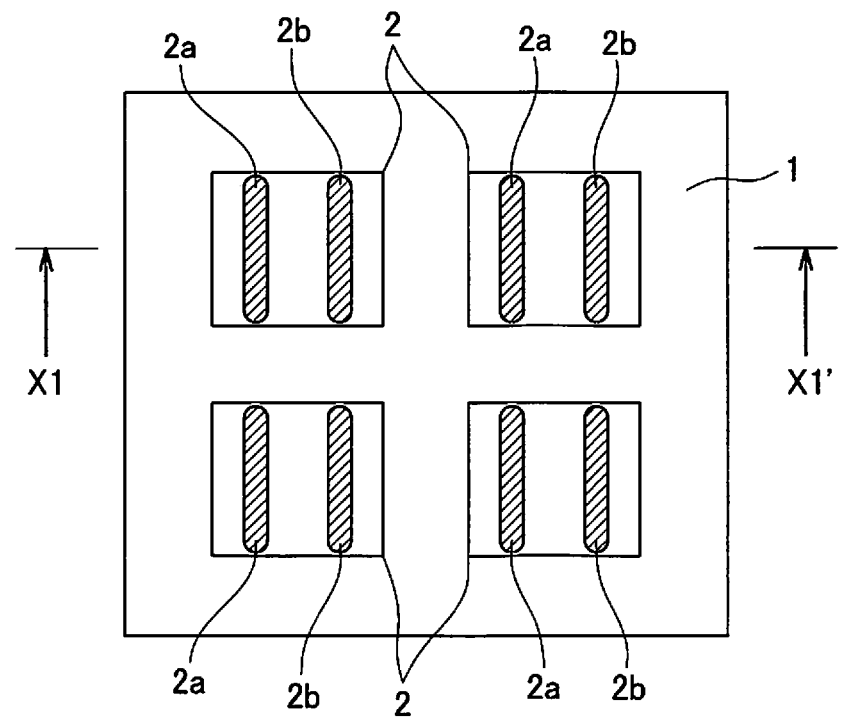
FIG. 1A is a schematic plan view showing a step of disposing a light emitting element on a support according to a method for manufacturing a light emitting device according to an embodiment.
Figure 1B:
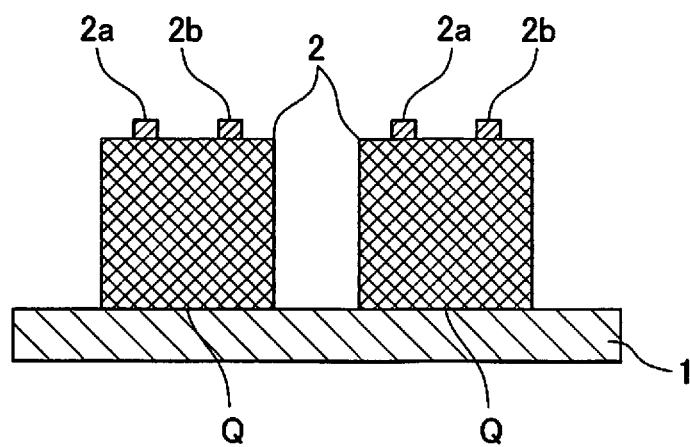
FIG. 1B is a schematic cross-sectional view taken along the line X1-X1' line in FIG. 1A.

First, as shown in FIGS. 1A and 1B, a plurality of light emitting elements 2 each having a main light emitting surface Q and a pair of electrodes 2a and 2b on an electrode formation surface, which is on the opposite side from the main light emitting surface Q, are disposed on a support 1 so as to be adjacent to each other and face upward.

The light emitting elements 2 include a semiconductor layer including at least a light emitting layer, and each have the main light emitting surface Q and the pair of positive and negative electrodes 2a and 2b on an electrode formation surface that is on the opposite side from the main light emitting surface Q. Thus using the light emitting elements 2 that are individually separated right from the wafer state allows light emitting devices to be formed at a high yield by selecting the characteristics and then using only those light emitting elements that have the desired characteristics in the manufacture of the light emitting devices.

The planar shape of the light emitting elements 2 may be circular, elliptical, triangular, quadrangular, pentagonal, hexagonal, or some other such polygonal shape, or the like. Also, the size and thickness of the light emitting elements 2 can be appropriately selected. In the Embodiment 1, for example, the light emitting elements 2 have a planar shape that is rectangular.

A support 1 on which the light emitting elements 2 will be disposed is prepared. The support 1 may be removed before cutting the metal layer and the covering member (discussed below), or may be used as a part of the light emitting device by being cut along with the metal layer and the covering member.

In Embodiment 1, a plurality of the light emitting elements 2 are disposed adjacent to each other on the support 1 so that the electrodes 2a and 2b of the light emitting elements 2 face upward, that is, so that the main light emitting surface Q is in contact with the support 1 and the upper surfaces of the electrodes 2a and 2b of the light emitting elements 2 are on the opposite side from the support 1. This facilitates the formation of the metal layer over the electrodes in a later step, and also facilitates the formation of the covering member so as to expose the main light emitting surface Q.

Furthermore, the plurality of light emitting elements 2 are preferably disposed so that the different poles of the respective light emitting elements 2 are adjacent to each other. More specifically, as shown in FIG. 1A, the plurality of light emitting elements 2 are preferably disposed so that the positive electrode 2a of one light emitting element 2 and the negative electrode 2b of another light emitting element 2 are adjacent to each other, and the negative electrode 2b of the one light emitting element 2 and the positive electrode 2a of the other light emitting element 2 are adjacent to each other.

The spacing of the light emitting elements 2 can be set as desired. This spacing affects the thickness of the covering member 3 and the recesses 3a (discussed below). Thus, it is preferable to adjust the spacing so that the desired thickness of the covering member 3 can be obtained. For example, although it depends on the arrangement accuracy of the light emitting elements 2, the cutting position accuracy in the subsequent dicing step, the configuration of the covering member 3, and the shape of the recesses 3a, the spacing of the light emitting elements 2 can be about 0.1 to 300 µm. This makes it easier to form the metal layer 4 in a subsequent step, and makes it possible to form a covering member 3 capable of sufficiently blocking light that leaks out from portions other than the main light emitting surface Q. Furthermore, the number of light emitting devices manufactured can be increased, and the light emitting devices can be manufactured more efficiently.

In laying out the light emitting elements 2 on the support 1, for example, it is possible to apply an adhesive agent to the support 1 and the light emitting elements 2 ahead of time, or to use a support 1 having an adhesive film and fix the light emitting elements 2 with the adhesive on the support 1. The adhesive agent can be any resin or the like known in this field. In particular, in the case where the support 1 is used as part of the light emitting device 10, it is preferable to use a transmissive resin. In the case where a sticky support 1 is used, the light emitting elements 2 may be fixed on the support 1 by the tackiness of the support 1. This allows the light emitting elements 2 to be efficiently disposed in just a few steps. A film in which an adhesive is disposed on a resin, a flat plate such as a ceramic, or the like can be used as the support 1.

1-2. Formation of Covering Member 3

Next, the side surfaces of the light emitting elements 2 are covered so as to expose the upper surfaces of the pair of electrodes 2a and 2b, and the covering member 3 having recesses 3a is formed between the light emitting elements 2.

1-2-1. Formation of Covering Member 3

In Embodiment 1, the covering member 3 that covers at least the side surfaces of the light emitting elements 2 is then formed. More specifically, a covering member 3 is formed on the support 1 so as to continuously cover the surfaces of the light emitting elements 2 disposed on the support 1 other than the portions opposite the support 1. Consequently, a covering member 3 for protecting the light emitting elements 2 can be easily formed, and furthermore, in the case where the covering member 3 has the property of either reflecting or blocking light, the leakage of light from areas other than the main light emitting surface Q can be prevented.

Figure 2A:
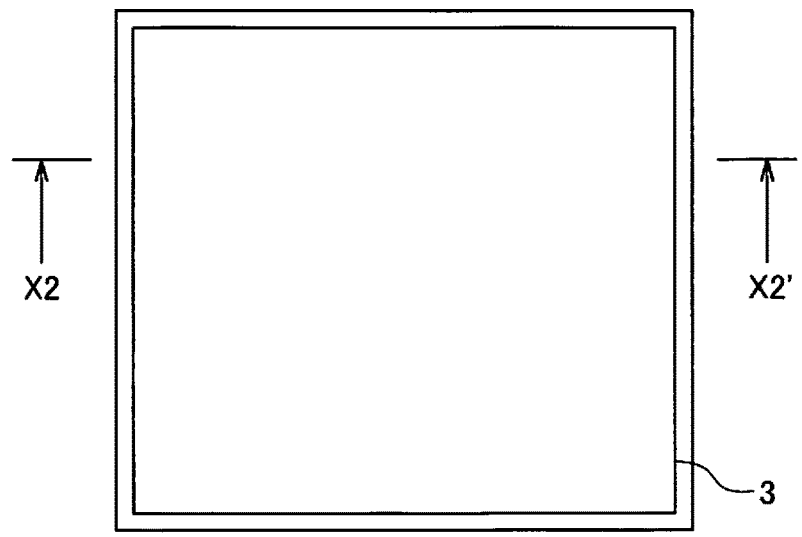
FIG. 2A is a schematic plan view showing a step of forming a covering member according to the method for manufacturing the light emitting device according to the embodiment.
Figure 2B:
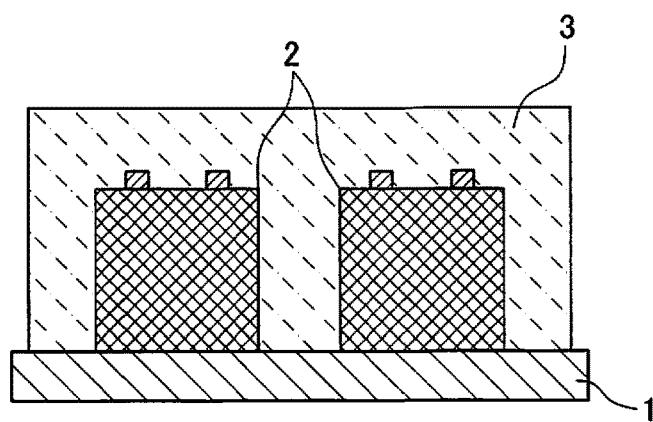
FIG. 2B is a schematic cross-sectional view taken along the line X2-X2' line in FIG. 2A.
Figure 3:
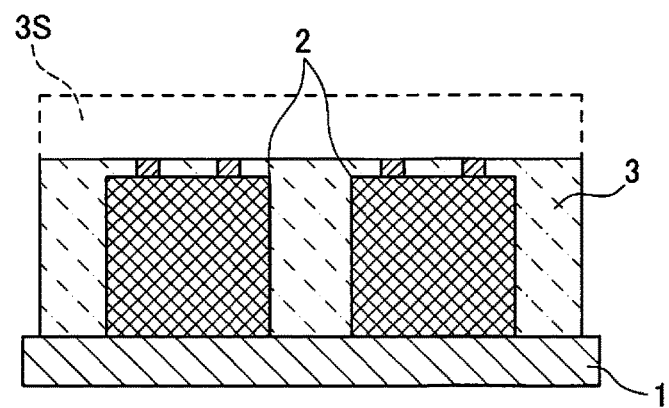
FIG. 3 is a schematic cross-sectional view taken showing a step of exposing the electrodes of a light emitting element from a covering member according to the method for manufacturing the light emitting device according to the embodiment.
Figure 4A:
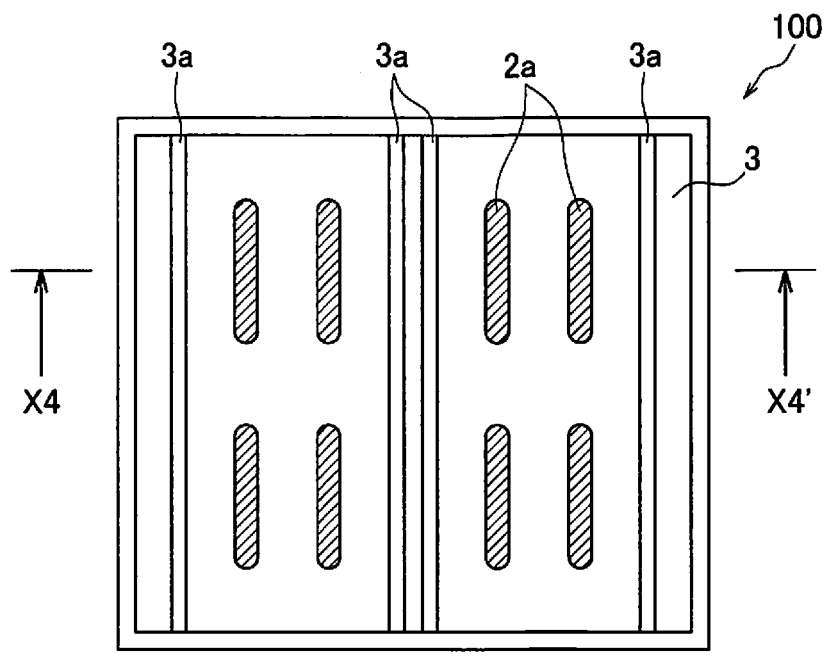
FIG. 4A is a schematic plan view showing a step of forming recesses in the covering member according to the method for manufacturing the light emitting device according to the embodiment.
Figure 4B:
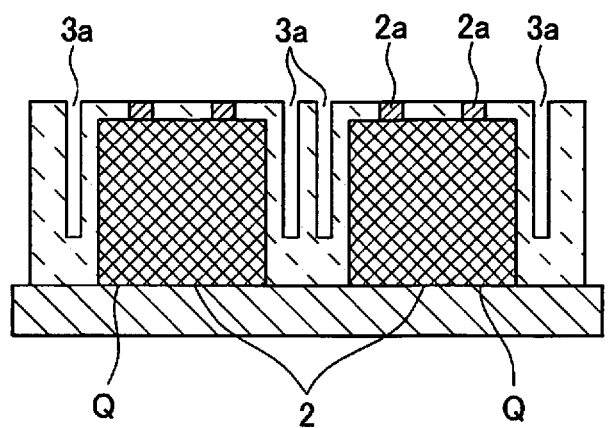
FIG. 4B is a schematic cross-sectional view taken along the line X4-X4' line in FIG. 4A.

As shown in FIGS. 4A and 4B, the covering member 3 is formed so that the electrodes 2a and 2b are exposed from the upper surface of the covering member 3. The covering member 3 may be formed in a shape such that the electrodes 2a and 2b are exposed from the outset, or, as shown in FIGS. 2A and 2B, for example, the covering member 3 can be formed at a height that covers the upper surfaces of the electrodes 2a and 2b, and a removal portion 3S at the upper part of the covering member 3 can be removed by cutting, polishing or the like to expose the electrodes 2a and 2b as shown in FIG. 3. Alternatively, the electrodes 2a and 2b may be exposed by removing the covering member 3 and the upper portions of the electrodes 2a and 2b. The step of exposing the electrodes 2a and 2b will be described in detail below.

The material of the covering member 3 can be one in which a reflective or light absorbing substance has been added to a resin or another such base material. The covering member can be formed by transfer molding, compression molding, screen printing, potting, spraying, or the like. In particular, in order to reliably form the covering member 3 all the way into the relatively narrow spaces between the light emitting elements 2, it is preferable to use a molding method featuring a metal mold, such as compression molding or transfer molding.

The covering member 3 may be formed all at once as discussed above (a mode in which part of the formed covering member 3 is removed shall also be referred to as forming all at once), or its formation may be broken up into a number of steps.

1-2-2. Electrode Exposure

In Embodiment 1, after the covering member 3 has covered up to the upper surfaces of the electrodes 2a and 2b, the covering member 3 is then removed as shown in FIG. 3, and the upper surfaces of the electrodes 2a and 2b of the light emitting elements 2 that were covered by the covering member 3 are exposed from the surface (upper surface) of the covering member 3. This brings the electrodes 2a and 2b into contact with the metal layer 4 that will be formed in a subsequent step, and forms electrodes that will supply electricity to the light emitting elements 2.

A method such as grinding, cutting, or etching can be used for the exposure of the electrodes 2a and 2b. In order to reduce the decrease in adhesion between the covering member 3 and the metal layer 4 provided in a subsequent step, and between the metal layer 4 and the electrodes 2a and 2b, in this step the upper surfaces of the electrodes 2a and 2b and the covering member 3 are preferably made flat so as to be substantially flush with each other. Grinding is preferable from this standpoint, and from the standpoint of improving mass productivity.

The exposure of the electrodes 2a and 2b may be performed simultaneously with the formation of the covering member 3, or may be performed after the covering member 3 has been formed.

1-2-3. Formation of Recesses

Next, in this embodiment, the recesses 3a are formed by removing part of the covering member 3. More specifically, as shown in FIGS. 4A and 4B, the cover member 3 between the plurality of light emitting elements 2 is cut in a direction substantially perpendicularly crossing the main light emitting surface Q of the light emitting elements 2. This allows the metal layer 4 formed in a subsequent step to be formed all the way up to the side surfaces of the light emitting device 10.

Removal of the covering member 3 for forming the recesses 3a can be performed, for example, by a cutting method that is known in this field, such as blade dicing using a blade, laser dicing, cutter scribing, drilling, or blasting using a mask.

In the case where the light emitting elements 2 disposed on the support 1 all have the same shape, it will be easier to form the recesses 3a in the covering member 3. Furthermore, since the side surfaces of two rectangular light emitting elements 2 are opposite each other in this embodiment, the covering member 3 is cut near and along the four sides of the light emitting elements 2 to easily form the recesses 3a. In a subsequent step, the covering member 3 and the metal layer 4 can be efficiently cut into individual light emitting devices.

The recesses 3a may be formed not only by removing part of the covering member 3 formed as in this embodiment, but also at the same time as the covering member 3 is formed. For example, the covering member 3 may be formed in a shape that covers the light emitting elements 2 and also has the recesses 3a in the mold used to form the covering member 3. The recesses 3a may be formed either before or after the above-mentioned step of exposing the electrodes 2a and 2b. In the case that the recesses 3a are formed after the step of exposing the electrodes 2a and 2b of the light emitting elements 2, they can be formed while confirming the positions of the electrodes 2a and 2b of the light emitting elements 2 with the camera, so this is preferable in terms of improving the mass productivity of the light emitting device 10 and the accuracy of forming the recesses 3a.

The recesses are preferably provided between the plurality of light emitting elements 2 at positions adjacent to the electrodes 2a and 2b of the light emitting elements. This makes it easier to connect the metal layer 4 provided in the recesses 3a to the electrodes 2a and 2b of the light emitting elements 2.

The shape of the inner surfaces of the recesses 3a substantially determines the shape of the castellation or the metal layer 4 on the side surfaces of the light emitting device 10 to be manufactured. Therefore, the shape of these inner surfaces should be what is required by the characteristics of the light emitting device 10 to be manufactured and the size.

For example, the depth (the width in the vertical direction in FIG. 4B) of the recesses 3a can be, for example, about 1% to 99% of the height of the light emitting device 10. When the depth of the recesses 3a is increased, the surface area of the metal layer 4 provided on the side surfaces of the light emitting device 10 can be increased, so the mounting strength can be increased when the light emitting device 10 is mounted on a mounting substrate. However, in the case where the recesses 3a are made too deep, the end of the metal layer 4 will be closer to the light emitting surface of the light emitting device 10, so there is the risk that the solder or other joining member used for mounting will affect the light emission of the light emitting device. Therefore, the depth of the recesses 3a is preferably set to about 20 to 50% of the height of the light emitting device 10, for example.

The shape of the recesses 3a in top view may be that of a rectangle that is longer direction running along the sides of the light emitting elements 2, a circle, or the like. The recesses 3a are preferably extended so that the metal layer 4 can be formed from end to end of one side surface of the light emitting device 10. Using a metal layer 4 such as this improves the mounting accuracy of the light emitting device 10.

The recesses 3a may be a single groove extending adjacent to the plurality of light emitting elements 2. This allows the recesses 3a to be easily formed by cutting or molding with a metal mold. On the other hand, a plurality of recesses that are separated from one another in top view may be provided. For instance, the recesses 3a may be separate but adjacent to each of the plurality of light emitting elements 2.

The width of the recesses 3a (their length in the lateral direction in FIG. 4B) are preferably provided wide enough that the metal layer 4 can be easily formed and cut. The side surfaces of the recesses 3a may be inclined or vertical.

The recesses 3a should be provided to the portions serving as the side surfaces of the light emitting device 10, and in the case where a light emitting device 10 having a plurality of light emitting elements 2 is manufactured, the recesses 3a need not be provided between all of the light emitting elements 2.

Figure 5A:
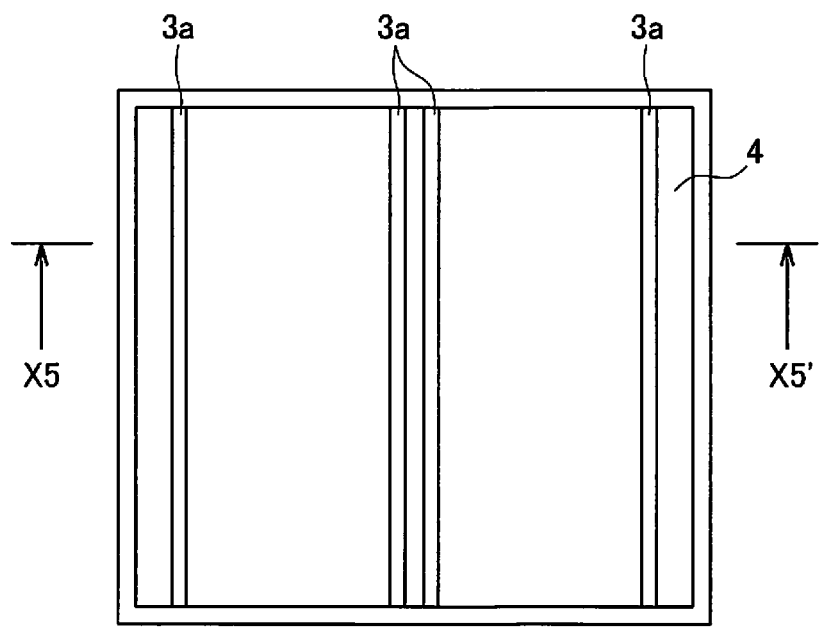
FIG. 5A is a schematic plan view showing a step of forming a metal layer according to the method for manufacturing the light emitting device according to the embodiment.
Figure 5B:
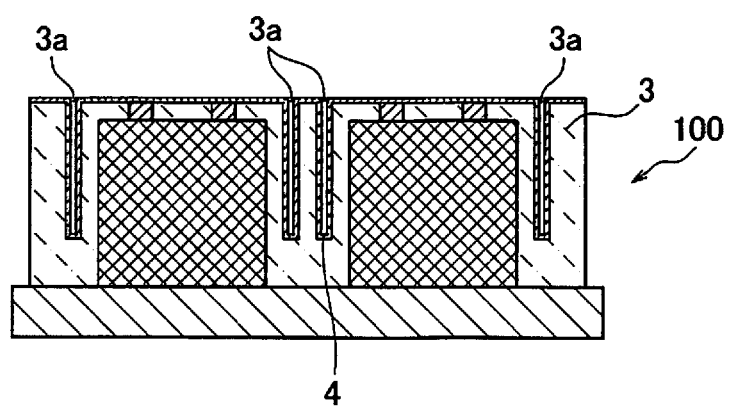
FIG. 5B is a schematic cross-sectional view taken along the line X5-X5' line in FIG. 5A.

As shown in FIG. 5B, two recesses, or two or more recesses, may be provided between two light emitting elements 2.

Figure 11:
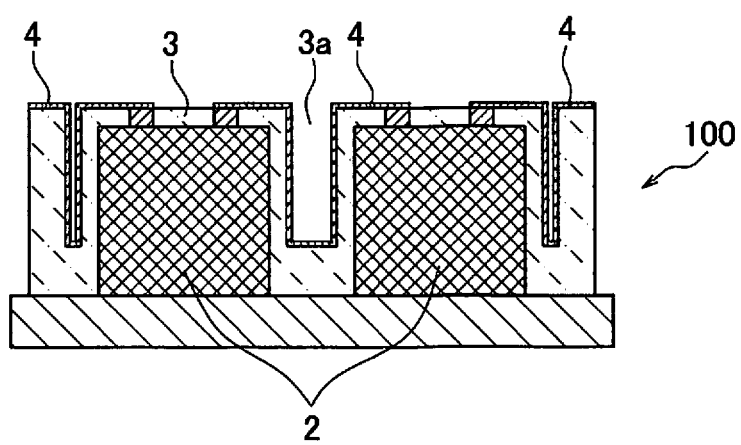
FIG. 11 is a schematic cross-sectional view showing a method for manufacturing a light emitting device according to the modified embodiment.

On the other hand, as shown in FIG. 11, just one recess 3a can be provided between two light emitting elements 2. This allows the width of the recess 3a to be increased without widening the spacing between the light emitting elements 2, so it is easier to perform cutting on the inner surfaces of the recesses 3a (discussed below). Also, the material of the relatively expensive metal layer 4 formed in the recesses 3a can be utilized more effectively, so a less expensive light emitting device can be manufactured.

An intermediate body 100 is obtained in this way.

Next, the metal layer 4 is formed so as to continuously cover the surfaces of the pair of electrodes 2a and 2b of the light emitting elements 2 and the inner surfaces of the recesses 3a of the covering member 3 in the intermediate body 100.

2. Formation of Metal Layer

As shown in FIGS. 5A and 5B, the metal layer 4 is formed over the surface (upper surface) of the light emitting elements of the intermediate body 100 where the electrodes are exposed, and the inner surfaces of the recesses 3a.

Since the metal layer 4 is used as a mounting terminal for the light emitting device 10, its structure takes into account the ease of mounting and adhesion of the light emitting device 10.

Examples of the material of the metal layer 4 include a one or more layers of gold, silver, nickel, aluminum, rhodium, copper, or an alloy of these. The layer in contact with the intermediate body 100 (the first layer of the metal layer) is preferably nickel in order to improve the adhesion. A layer of ruthenium is preferably included in order to prevent diffusion of the mounting solder into the metal layer 4. Also, it is preferable to use gold for the outermost surface because of its high corrosion resistance, etc. That is, it is preferable to use a laminated structure of Ni/Ru/Au, starting from the side closer to the intermediate body 100.

The metal layer 4 is preferably thin, and if needed a condition can be that sufficient bonding strength be ensured when the light emitting device 10 is joined to the mounting substrate. The thickness preferably is such that laser ablation can occur selectively, such as 1 μm or less, with 100 nm or less being even better. Also, a thickness that will allow electrode corrosion to be reduced, such as 5 nm or more, is preferable. The thickness of the metal layer refers to the total thickness of the plurality of layers in the case where the metal layer is made up of a plurality of laminated layers.

In the case where the metal layer 4 has a laminated structure, the thickness of one layer of the laminated structure can be from 1 to 100 nm, for example, with about 15 to 100 nm being preferable.

This metal layer 4 can be formed by ALD, CVD, sputtering, or vapor deposition. Of these, sputtering allows the metal layer 4 to be easily formed more easily.

Figure 6A:
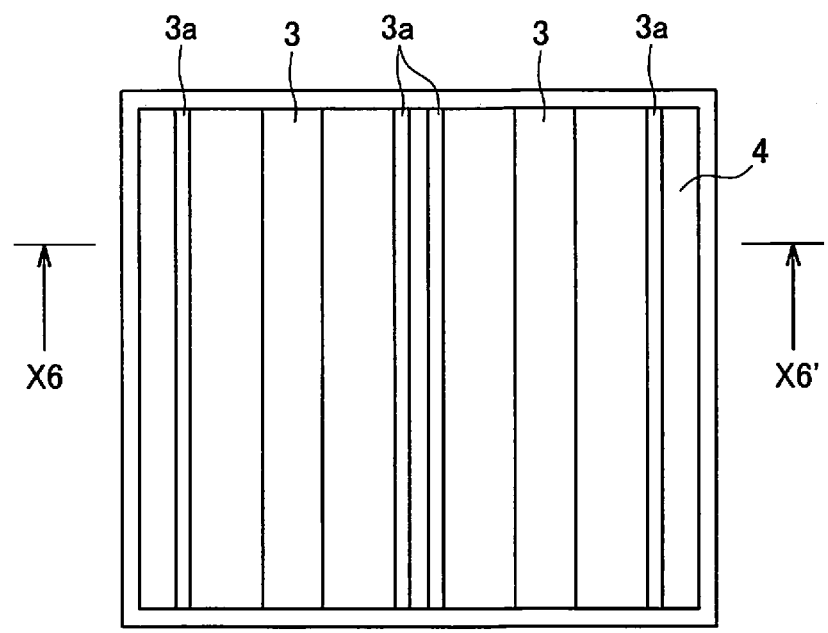
FIG. 6A is a schematic plan view showing a step of removing the metal layer from between a pair of electrodes according to the method for manufacturing the light emitting device according to the embodiment.
Figure 6B:
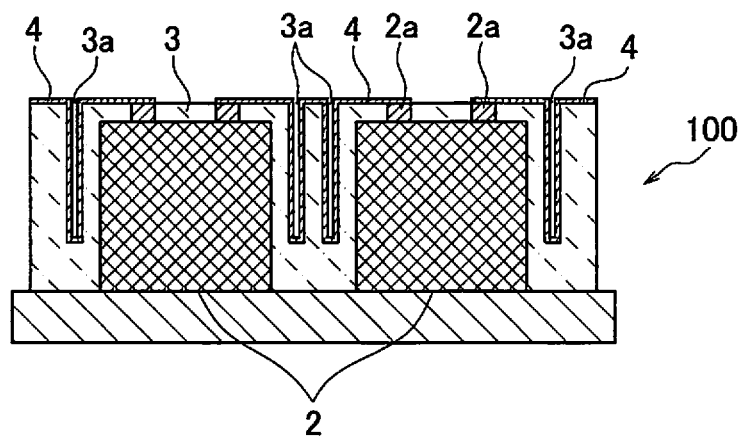
FIG. 6B is a schematic cross-sectional view taken along the line X6-X6' line in FIG. 6A.

In Embodiment 1, first, a single, continuous metal layer 4 is formed over substantially the entire surface of the covering member 3 and the plurality of electrodes 2a and 2b. Therefore, as shown in FIGS. 6A and 6B, the part of the metal layer 4 that is located so as to connect the positive and negative electrodes 2a and 2b of one light emitting element 2 is removed. In the case that the part of the metal layer 4 does not removed, this part will cause the electrodes 2a and 2b to short-circuit, electrical supply to the light emitting device 10 will be disrupted, and the light emitting device 10 will be destroyed. The metal layer 4 between the electrodes 2a and 2b can be removed in a uniaxial direction parallel to the electrodes 2a and 2b by laser irradiation, etching, or router machining, for example. In particular, laser irradiation allows the metal layer to be removed easily and accurately by ablation.

Thus, forming the metal layer 4 by removing part of the metal layer 4 provided over substantially the entire surface of one surface of the intermediate body 100 is preferable to forming the metal layer 4 by patterning with the mask or the like, because it is easier, and therefore lends itself better to mass production.

The height of the metal layer 4 on the side surfaces of the light emitting device 10 is about 1% to 99%, and preferably about 10 to 75%, and more preferably about 15 to 50%, of the height of the light emitting device 10 from the surface of the light emitting device 10 that is opposite the mounting substrate. The height of the metal layer 4 can be controlled by means of the depth of the recesses 3a in the case where the metal layer 4 is formed non-selectively on the upper surface of the intermediate body 100.

In this embodiment, since a plurality of light emitting elements 2 are disposed so that the region between the electrodes 2a and 2b of the light emitting elements 2 is in the form of a single band in plan view, the metal layer 4 in between the positive and negative electrodes 2a and 2b of the light emitting elements 2 can be easily removed. In order to remove the metal layer between the electrodes 2a and 2b in a straight line, it is preferable for the disposition of the light emitting elements 2 on the support 1 to be done in a state of little positional deviation. In the case where the light emitting elements 2 are arranged with good precision, there will be less of the variance in the shape of the electrodes that occurs when the metal layer 4 between the electrodes 2a and 2b is removed, so the light emitting device productivity and the consistency of quality can be improved.

As long as the metal layer 4 provided on the inner surfaces of the recesses 3a are electrically connected to the electrodes 2a and 2b of the light emitting elements 2, the other portion provided to the intermediate body 100 may also be removed. For example, when the covering member 3 and the metal layer 4 are cut (discussed below), or when dicing into the individual light emitting devices 10, the metal layer 4 provided on the upper surface of the intermediate body 100 at the position to be cut may also be removed. This reduces the generation of metal burrs or debris during cutting, and allows the light emitting device 10 to be manufactured stably.

After completion of the light emitting device 10, the portion corresponding to the peripheral part of the bottom surface of the light emitting device 10 (the surface called the upper surface in the state of the intermediate body 100) may be removed.

Also, with the metal layer 4, the portion connected to one electrode 2a of a light emitting element 2 and the portion connected to the other electrode 2b may have substantially the same shape or may have different shapes. For example, by making these shapes different from each other, they can be used as a mark for discriminating the polarity of the light emitting device 10. This removal can be accomplished by laser irradiation, or etching, router machining, or the like. In particular, laser irradiation allows the removal of the metal layer 4 to be carried out with good accuracy, so a relatively complicated shape can be easily formed.

Also, the metal layer 4 may be provided over the entire inner surfaces of the recesses 3a, or just over a portion thereof.

3. Cutting of Covering Member and Metal Layer

Figure 7A:
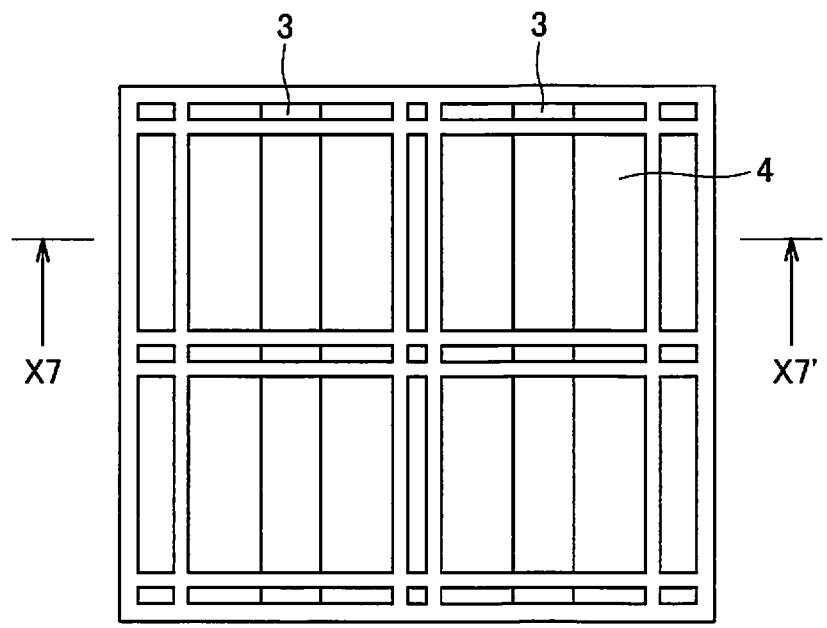
FIG. 7A is a schematic plan view showing a step of cutting the metal layer at the inner surfaces of the recesses according to the method for manufacturing the light emitting device according to the embodiment.
Figure 7B:
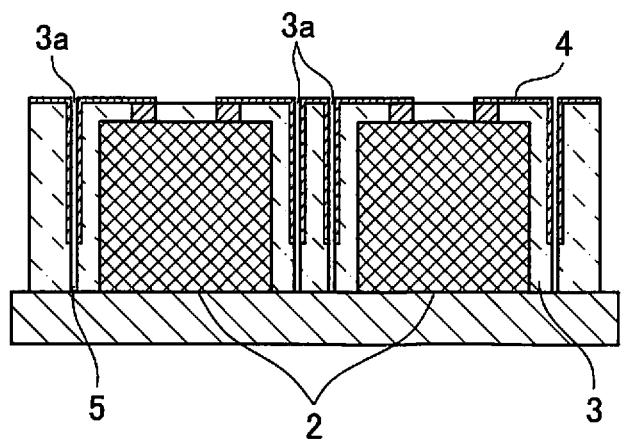
FIG. 7B is a schematic cross-sectional view taken along the line X7-X7' line in FIG. 7A.

Next, as shown in FIGS. 7A and 7B, the covering member 3 and the metal layer 4 are cut at the inner surfaces of the recesses 3a.

At this point, the covering member 3 and the metal layer 4 can also be cut at the portion without the recesses 3a.

It is not necessary to perform cutting in all the recesses 3a. For example, in the case where manufacturing a light emitting device that has a plurality of light emitting elements 2, the light emitting device may have the recesses 3a (and the metal layer 4) in the covering member 3 between a plurality of light emitting elements 2, without the recesses 3a disposed between the light emitting elements 2 being cut.

Cutting is performed by any method that allows the covering member 3 and the metal layer 4 to be cut. For instance, blade dicing using a blade, laser dicing, cutter scribing, or the like can be used.

In this embodiment, since the inner surfaces of the recesses 3a, which are each a groove extending adjacent to the light emitting elements 2, are cut using a dicer, cutting can be easily performed.

As shown in FIG. 7B, cutting of the covering member and the metal layer may be accomplished by cutting the recesses 3a in the approximate center of one recess 3a to split the recess 3a in two. Also, of the side surfaces of the inner surfaces of the recesses 3a, the one farther away from the light emitting element 2 may be removed. Also, two recesses 3a may be cut at once so as to remove the covering member disposed between the two recesses 3a in FIG. 7A. Consequently, the number of cuts can be reduced, and cutting can be performed simultaneously with the removal of the covering member not used in the light emitting device, so manufacturing can be performed more easily. Also, as shown in FIG. 11, just one recess 3a provided between two light emitting elements 2 may be cut, and the two side surfaces of one recess 3a may be provided as the side surfaces of two light emitting devices. This reduces the number of cuts, so manufacturing can be performed more easily.

In this embodiment, since the covering member 3 is completely cut at the same time when the covering member 3 and the metal layer 4 are cut at the inner surfaces of the recesses, it is possible to obtain individual light emitting devices at the same time (discussed below), and mass productivity can be increased. After the cutting of the covering member 3 and the metal layer 4, there may be a formation step or the like, such as removing the covering member 3 or the metal layer 4.

Obtaining Individual Light Emitting Devices

In this embodiment, as shown in FIGS. 7A and 7B, the covering member 3 and the metal layer 4 are also cut at portions other than the recesses 3a to form separation grooves 5 and obtain individual light emitting devices 10.

As discussed above, when the light emitting elements 2 disposed on the support 1 all have the same shape, individual light emitting devices 10 can be easily obtained in addition to the formation of the recesses 3a. In Embodiment 1, since the side surfaces of a plurality of rectangular light emitting elements 2 are disposed opposite each other, it is easy to cut along the sides of the light emitting element 2, and individual light emitting devices can be obtained more efficiently.

Figure 8:
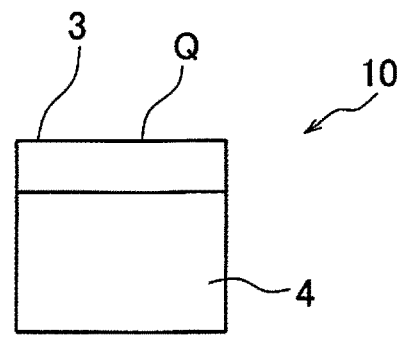
FIG. 8 is a schematic side view of a single light emitting device according to the embodiment.
Figure 9:
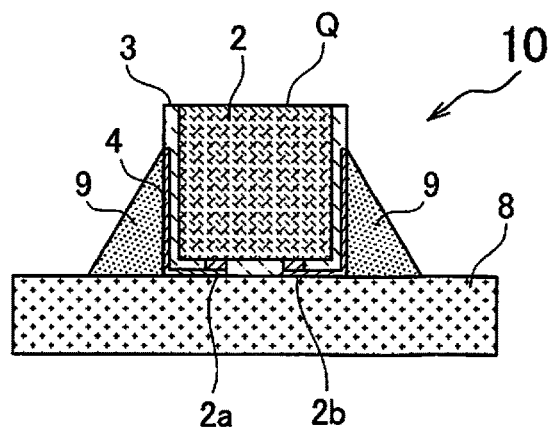
FIG. 9 is a schematic cross-sectional view showing an example in which a light emitting device shown in FIG. 8 is joined to a mounting board.

As discussed above, in the case where individual light emitting devices are obtained and mounted on the mounting substrate 8 as shown in FIGS. 8 and 9, the metal layer 4 that becomes the electrodes of the light emitting devices 10 can be formed all the way to the surfaces (the side surfaces) that are substantially perpendicular to the main light emitting surface Q. Even though electrodes are not formed on the surfaces of the electrodes 2a and 2b in the same shape as the electrodes of the mounting substrate 8, mounting can be performed using the metal layer 4 on the side surfaces of the light emitting device 10, to manufacture a side-view type of light emitting device 10 that is in which the main light emitting surface Q is perpendicular to the mounting surface of the mounting substrate 8.

This makes it possible to form a light emitting device 10 which can be easily mounted on the mounting substrate 8.

Thus providing the metal layer 4 used for mounting along the side surfaces of the light emitting device 10 allows mounting of the light emitting device to be performed more easily and accurately. Also, since solder fillets are formed on the metal layer 4 on the side surfaces of the light emitting device 10 when mounted, it is easy to check the mounting of the light emitting device 10, and adhesive strength can be increased when the mounting board 8 and the light emitting device 10 have been mounted. Consequently, this can be used to advantage in a compact light emitting device 10 used in a light source for the backlight of a liquid crystal display, etc., with which mounting is relatively difficult, and with which it is difficult to increase the surface area of the electrodes.

The metal layer 4 is preferably provided over a large surface area on the bottom surface of the light emitting device 10. For example, it is preferably provided over 20% to 90%, and more preferably 50% to 80%, of the surface area of the bottom surface of the light emitting device 10. This improves the heat dissipation and mounting strength of the light emitting device 10.

By disposing the side surfaces of the metal layer 4 so as to be substantially flush with the side surfaces of the light emitting device 10, when mounting a plurality of light emitting devices 10 side by side, the above-mentioned effect can be obtained, while the spacing between the light emitting devices 10 can be reduced. This means that the light emitting devices 10 can be mounted at a higher density.

In this embodiment, the groove recesses 3a are provided one on each side of each light emitting element 2, but just one recess may be provided between adjacent light emitting elements 2. By thus cutting at the inner surface of a single recess, the metal layer 4 may be formed on the side surfaces of each of two light emitting devices adjacent to the recesses. This reduces the number of cuts and improves manufacturing efficiency.

Figure 10:
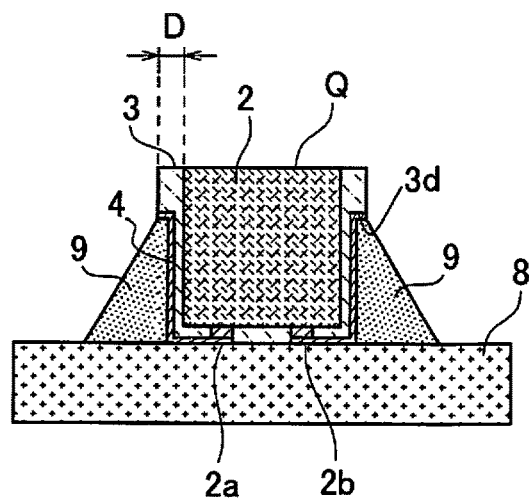
FIG. 10 is a schematic side view of a single light emitting device according to a modified embodiment.

In the present embodiment, as shown in FIG. 9, the covering member 3 of the light emitting device 10 and the outer surface of the metal layer 4 are provided so as to be substantially flush, but as shown in FIG. 10, the covering member 3 of the light emitting device may have an opening on the side surface of the light emitting device, and castellation may be provided by disposing part of the metal layer 4 in the opening. Thus providing the metal layer 4 in the opening allows the surface area where the solder and the metal layer 4 are bonded to each other to be increased without raising the height of the metal layer 4, and enhances the mounting reliability of the light emitting device. A metal layer 4 such as this is formed by widening the recesses 3a when the intermediate body is prepared, forming the metal layer 4 on the inner surfaces of the recesses 3a, and then cutting so that part of the bottom surfaces 3d of the recesses 3a remains in the light emitting device. This opening can be formed by leaving not only the side surfaces but also the bottom surfaces 3d of the inner surfaces of the recesses 3a, for example, in the light emitting device when cutting the covering member 3 and the metal layer 4.

4. Other Steps

Besides the above steps, a step of forming a wavelength conversion layer, a step of forming a transmissive layer, or the like may also be carried out as needed, for example.

In the step of forming the wavelength conversion layer, the wavelength conversion layer that converts the light emitted from the main light emitting surface Q to the desired wavelength can be formed so as to cover the main light emitting surface Q. The wavelength conversion layer can be, for example, one that contains a wavelength converting material such as a phosphor in a matrix such as a resin or glass. The wavelength conversion layer can be formed by spraying, printing, coating, affixing, or any other desired manner. A light emitting device with good contrast between the light emitting portion and the non-emitting portion (known as distinguishability) can be formed by also covering the side surfaces of the wavelength conversion layer with the covering member. Depending on its configuration, the wavelength conversion layer may be formed before or after any of the above steps. For example, a sheet composed of a transmissive resin or the like containing a wavelength converting material may be used as the support 1, and this support 1 may be used as a wavelength converting layer. Also, a light emitting device with good distinguishability can be manufactured by forming in advance a wavelength conversion layer whose periphery is surrounded by a frame of a light-blocking member, and affixing this to the main light emitting surface prior to formation of the covering member. Also, the covering member may be formed after bonding the wavelength conversion layer to the main light emitting surfaces of the light emitting elements prior to formation of the covering member. The wavelength conversion layer and the light emitting elements can be easily positioned by bonding the main light emitting surfaces of the light emitting elements so as to be opposite each other on the wavelength conversion layer. A silicone resin or another such transmissive adhesive can be used to bond the light emitting elements to the wavelength conversion layer. This transmissive adhesive may be provided between the side surfaces of the light emitting elements and the covering member.

The step of forming a transmissive layer is a step of forming a transmissive layer over the light emitting surface of the light emitting device (more specifically, the wavelength conversion layer or the main light emitting surface Q). Forming a transmissive layer protects the light emitting surface of the light emitting device. The transmissive layer can be, for example, resin, glass, etc., that is transmissive. Also, adding a filler or the like improves light extraction and reduces tackiness. The transmissive layer can be formed, for example, by spraying, printing, coating, affixing, or any other method desired. In the case where the above-mentioned wavelength conversion layer is used, it is preferably provided to the light emitting elements after the wavelength conversion layer and the transmissive layer have been formed in a laminated state first.

Each of the constituent members will be described below.

Light Emitting Elements 2

The light emitting elements 2 can be light emitting diodes, laser diodes, or the like that are commonly used in this field. For example, it is possible to use a variety of semiconductors such as a nitride-based semiconductor ($In_XAl_YGa_{1-X-Y}N$, $0<X$, $0<Y$, $X+Y<1$), a group III-V compound semiconductor such as GaP and GaAs, ZnSe, or a group II-VI compound semiconductor. The light emitting elements 2 may have a substrate for growing the semiconductor layer. Examples of substrates include sapphire and other such insulating substrates, and substrates composed of SiC, ZnO, silicon, GaAs, diamond, lithium niobate that forms a lattice junction with a nitride semiconductor, gallium neodymium, and other substrates composed of an oxide. The substrate may be removed by laser lift-off method, etc.

Support 1

As mentioned above, the support 1 can be a sheet of resin, ceramic, glass, or the like. From the standpoint of heat resistance, the use of a sheet of polyimide resin is particularly favorable.

The planar shape, size, thickness, and so forth of the support 1 can be suitably adjusted depending on the size and number of the light emitting elements 2 to be disposed. In particular, the support 1 is preferably in the form of a sheet that has a uniform thickness and whose surface is flat, because it will be easier for the light emitting elements 2 to be disposed stably.

In the case where the support 1 is used as part of the light emitting device, it is preferably transmissive, and the transmittance of light from the light emitting elements 2 is preferably at least 60%, more preferably at least 70%, and even more preferably 80%, with at least 90% being better still.

In particular, in the case where the support 1 is used as part of the light emitting device, it is preferable to use a resin for the support 1. Examples include a support formed from a silicone resin, a modified silicone resin, an epoxy resin, a modified epoxy resin, a phenol resin, a polycarbonate resin, an acrylic resin, a TPX resin, a polynorbornene resin, or a hybrid resin containing one or more of these resins. Of these, a silicone resin or epoxy resin is preferable, and a silicone resin is especially good because of its excellent light resistance and heat resistance.

Furthermore, in the case where the support 1 is used as part of the light emitting device, and the support 1 is made to contain a wavelength conversion member that converts the wavelength of light from the light emitting elements, such as a phosphor and/or a luminescent substance, the result can be used as the wavelength conversion layer of the light emitting device.

The phosphor and/or luminescent substance can be, for example, a yttrium-aluminum garnet (YAG) phosphor.

The support 1 may contain a filler (such as a diffusing agent or a colorant). Examples include silica, titanium oxide, zirconium oxide, magnesium oxide, glass, phosphor crystals, a sintered phosphor, and sinters of a phosphor and inorganic binder compound.

Covering Member 3

The covering member 3 can be formed, for example, from a material obtained by adding a reflective or light absorbing substance to a resin base material. This makes it easier to mold the covering member 3 into the desired shape. Examples of the resin include silicone resins, a modified silicone resin, an epoxy resin, a modified epoxy resin, an unsaturated polyester resin, a polyimide resin, a modified polyimide resin, a phenol resin, a urethane resin, an acrylate resin, a urea resin, an acrylic resin, a polyphthalamide (PPA), a polyphenylenesulfide (PPS), and a liquid crystal polymer. These may be used alone or in combinations of two or more types. A silicone resin is particularly favorable from the standpoint of heat resistance and weather resistance.

A compact light emitting device with which light emitted from somewhere other than the main light emitting surface Q of the light emitting elements can be sufficiently blocked can be formed by setting the thickness of the covering member 3 (the distance from a side surface of a light emitting element 2 to a side surface of the light emitting device 100; D in FIG. 10) to between 10 and 100 μm, for example.

Examples of a reflective or light absorbing substance include ceramics, titanium dioxide, silica dioxide, zirconium dioxide, potassium titanate, alumina, aluminum nitride, silicon nitride, boron nitride, mullite, niobium oxide, zinc oxide, barium sulfate, and various rare-earth oxide (such as yttrium oxide or gadolinium oxide). The reflective or light absorbing substance is preferably contained in an amount of about 20 to 80 wt %, and more preferably about 30 to 70 wt %, of the total weight of the covering member. This ensures that the covering member will have good strength and light blocking properties.

The light emitting device according to embodiments of the present invention can be used for a variety of light emitting devices such as an illumination light source, a light source for various types of indicators, an in-vehicle light source, a light source for displays, a light source for backlights of liquid crystal displays, a light source for sensors, traffic lights, and the like.

What is claimed is:

1. A method for manufacturing a light emitting device comprising:
    preparing an intermediate body including
        a plurality of light emitting elements spaced apart from each other, each of the light emitting elements having a pair of electrodes disposed on the same side, and
        a covering member covering side surfaces of the light emitting elements while a part of a surface of each of the electrodes is exposed from the covering member, the covering member having a recess between adjacent ones of the light emitting elements;
    forming a metal layer that continuously covers the surface of each of the electrodes of the light emitting elements and an inner surface of the recess of the covering member; and
    cutting the metal layer and the covering member at the inner surface of the recess.

2. The method for manufacturing a light emitting device according to claim 1, wherein
    the recess is formed by removing a part of the covering member.

3. The method for manufacturing a light emitting device according to claim 1, wherein
    the forming of the metal layer is performed by ALD, CVD, sputtering, or vapor deposition.

4. The method for manufacturing a light emitting device according to claim 1, further comprising
    removing a part of the metal layer after the forming of the metal layer.

5. The method for manufacturing a light emitting device according to claim 4, wherein
    the removing of the metal layer is performed by irradiating the metal layer with a laser.

6. The method for manufacturing a light emitting device according to claim 1, wherein
    the metal layer includes Ru.

7. The method for manufacturing a light emitting device according to claim 1, wherein
    the forming of the metal layer includes forming the metal layer having a laminated structure of Ni/Ru/Au.

8. The method for manufacturing a light emitting device according to claim 1, wherein
    the preparing of the intermediate body includes preparing the intermediate body including the covering member having a plurality of recesses including the recess between the adjacent ones of the light emitting elements.

9. The method for manufacturing a light emitting device according to claim 1, wherein
    the forming of the metal layer includes forming the metal layer to continuously cover inner surfaces of the recesses of the covering member.

* * * * *